US009576896B2

(12) United States Patent
Liao et al.

(10) Patent No.: US 9,576,896 B2
(45) Date of Patent: Feb. 21, 2017

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Yu-Chieh Liao, Taoyuan (TW); Cheng-Chi Chuang, New Taipei (TW); Tai-I Yang, Hsinchu (TW); Tien-Lu Lin, Hsinchu (TW); Yung-Hsu Wu, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/137,110

(22) Filed: Apr. 25, 2016

(65) Prior Publication Data

US 2016/0240477 A1    Aug. 18, 2016

Related U.S. Application Data

(62) Division of application No. 14/208,096, filed on Mar. 13, 2014, now Pat. No. 9,349,690.

(51) Int. Cl.
*H01L 23/48* (2006.01)
*H01L 23/522* (2006.01)
(Continued)

(52) U.S. Cl.
CPC ......... *H01L 23/5226* (2013.01); *H01L 21/768* (2013.01); *H01L 21/7682* (2013.01);
(Continued)

(58) Field of Classification Search
CPC ............... H01L 21/7682; H01L 21/768; H01L 21/76849; H01L 21/76843; H01L 23/53238; H01L 23/5222; H01L 23/53295; H01L 2924/00; H01L 2924/0002
See application file for complete search history.

(56) References Cited

U.S. PATENT DOCUMENTS

| 2012/0193814 A1* | 8/2012 | Dunne | H01L 23/481 257/774 |
| 2013/0062736 A1* | 3/2013 | Brighton | H01L 21/76898 257/621 |

OTHER PUBLICATIONS

Static and Dynamic Test Power Reduction in Scan-Based Testing, IEEE, 2009, Sying-Jyan et al., pp. 56-59.

* cited by examiner

*Primary Examiner* — Hoa B Trinh
(74) *Attorney, Agent, or Firm* — Cooper Legal Group, LLC

(57) ABSTRACT

A semiconductor arrangement and method of formation are provided. The semiconductor arrangement includes an interconnect which includes an interconnect metal plug surrounded by a second metal layer. The interconnect is adjacent a sidewall of a dielectric, such that an air gap is between the interconnect and the sidewall of the dielectric. A protective barrier is over the interconnect and the air gap, and is over and in direct physical contact with a top surface of the dielectric. The interconnect metal plug surrounded by the second metal layer is less susceptible to damage than an interconnect metal plug that is not surrounded by a second metal layer. The protective barrier in direct physical contact with the dielectric reduces parasitic capacitance, which reduces an RC delay of the semiconductor arrangement, as compared to a semiconductor arrangement that does not have a protective barrier in direct physical contact with a dielectric.

20 Claims, 10 Drawing Sheets

(51) Int. Cl.
*H01L 23/532* (2006.01)
*H01L 21/768* (2006.01)
(52) U.S. Cl.
CPC ...... *H01L 23/5222* (2013.01); *H01L 23/5329* (2013.01); *H01L 23/53238* (2013.01); *H01L 23/53295* (2013.01); *H01L 21/76843* (2013.01); *H01L 21/76849* (2013.01); *H01L 2924/0002* (2013.01)

SEMICONDUCTOR ARRANGEMENT AND FORMATION THEREOF

RELATED APPLICATION

This application is a divisional of and claims priority to U.S. patent application Ser. No. 14/208,096, titled "SEMICONDUCTOR ARRANGEMENT AND FORMATION THEREOF" and filed on Mar. 13, 2014, which is incorporated herein by reference.

BACKGROUND

A semiconductor arrangement comprises one or more contacts. Contacts are used to make electrical connections in or among different features in a semiconductor arrangement. A contact, for example, is used to connect one metal layer to another metal layer, where the metal layers are otherwise electrically isolated from one another, such as by an insulating or dielectric material separating the metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
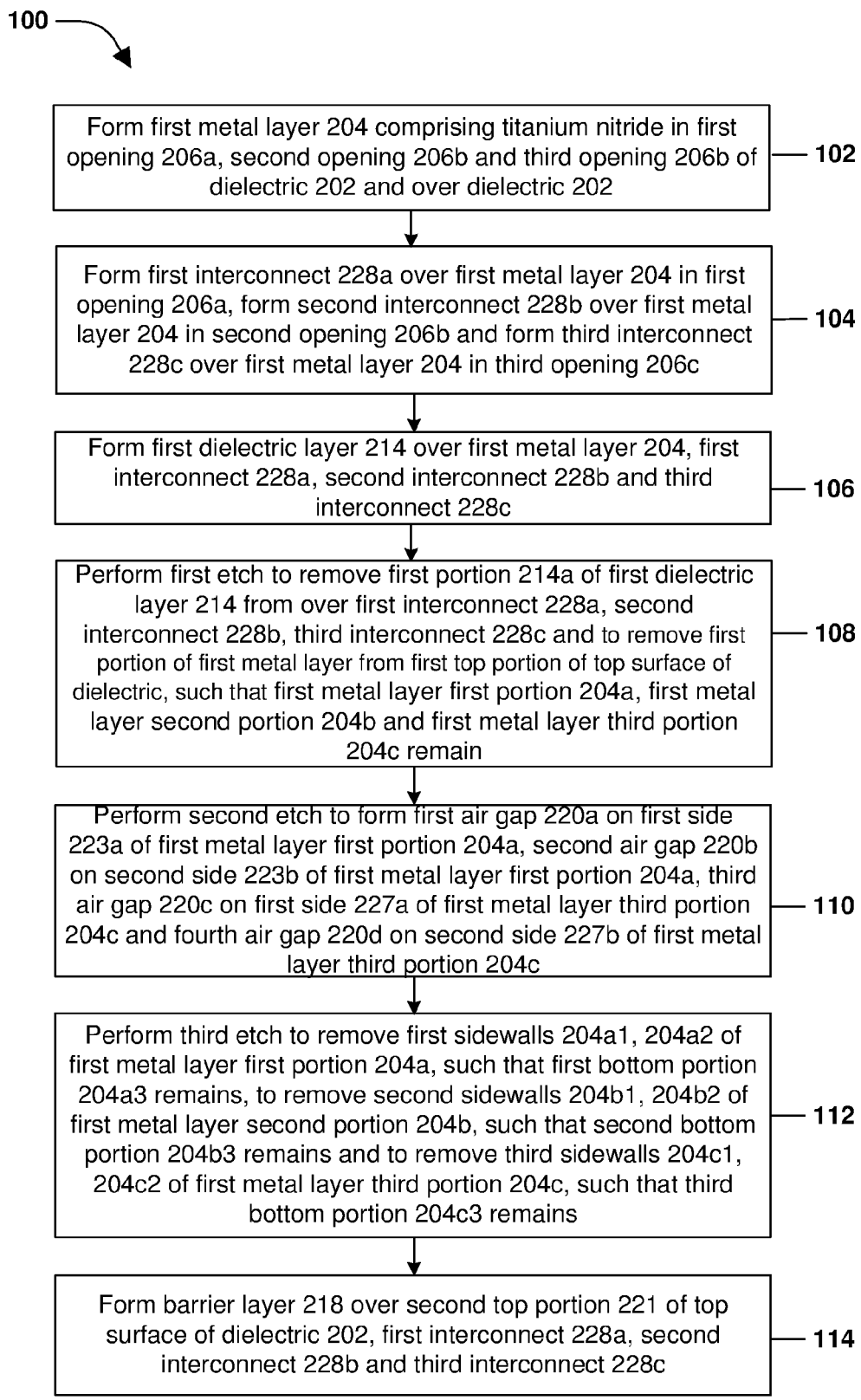
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 2:
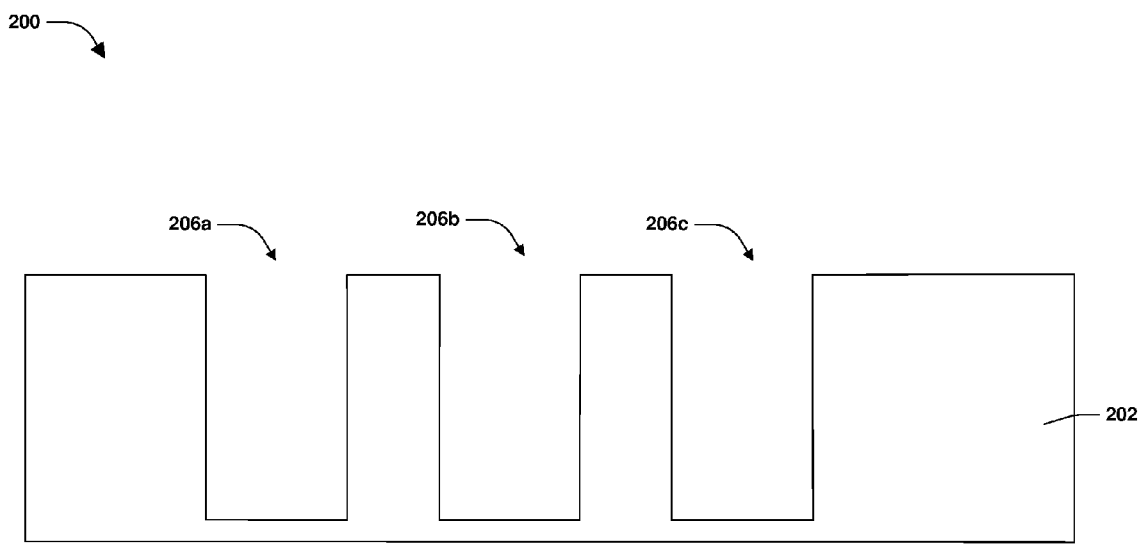
FIG. 2 is an illustration of a semiconductor arrangement, in accordance with some embodiments.
Figure 3:
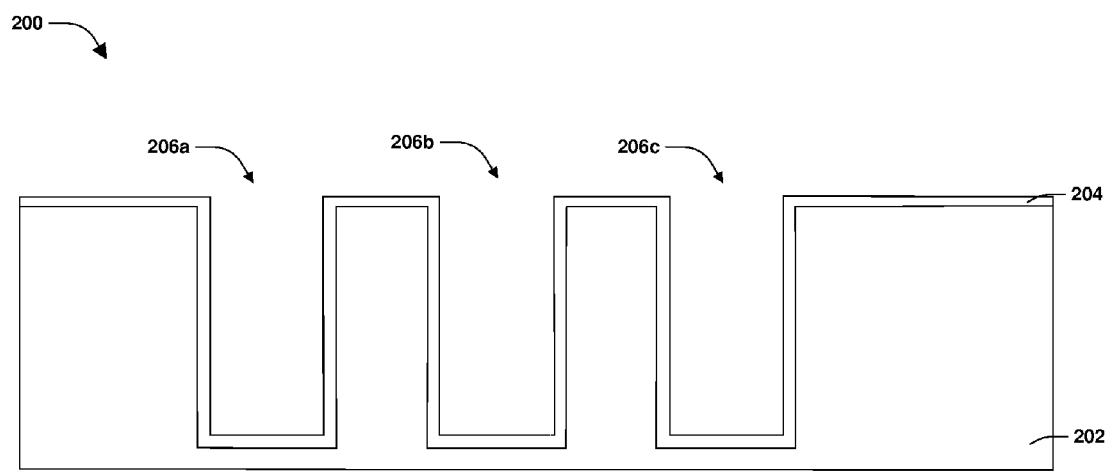
FIG. 3 is an illustration of a semiconductor arrangement, in accordance with some embodiments.
Figure 4:
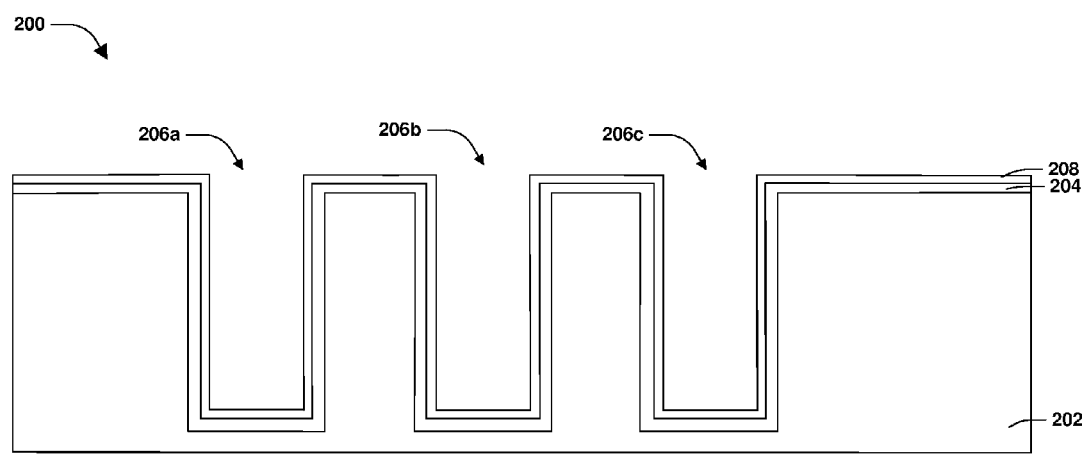
FIG. 4 is an illustration of a semiconductor arrangement, in accordance with some embodiments.
Figure 8:
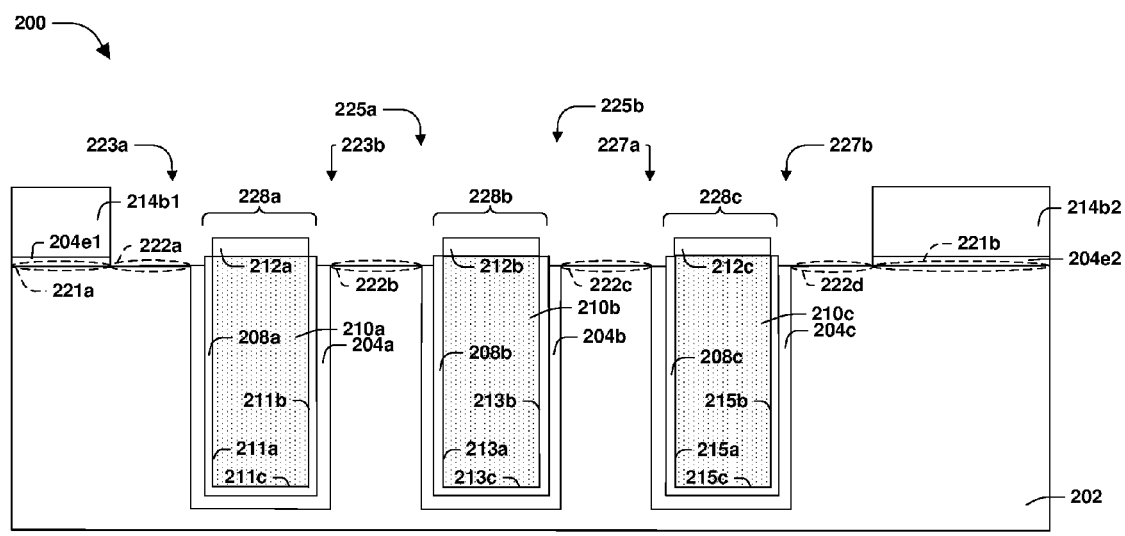
FIG. 8 is an illustration of a semiconductor arrangement, in accordance with some embodiments.
Figure 9:
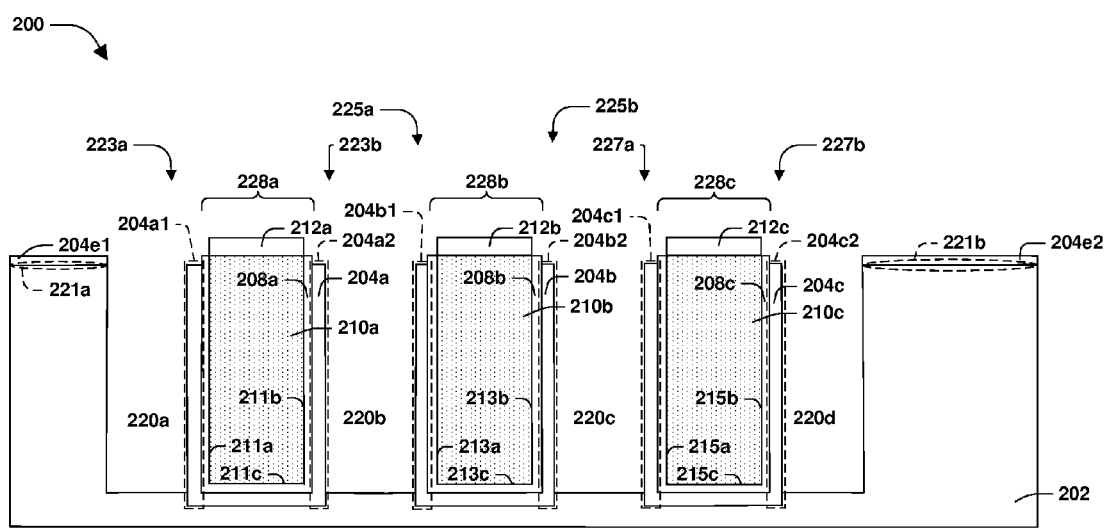
FIG. 9 is an illustration of a semiconductor arrangement, in accordance with some embodiments.
Figure 10:
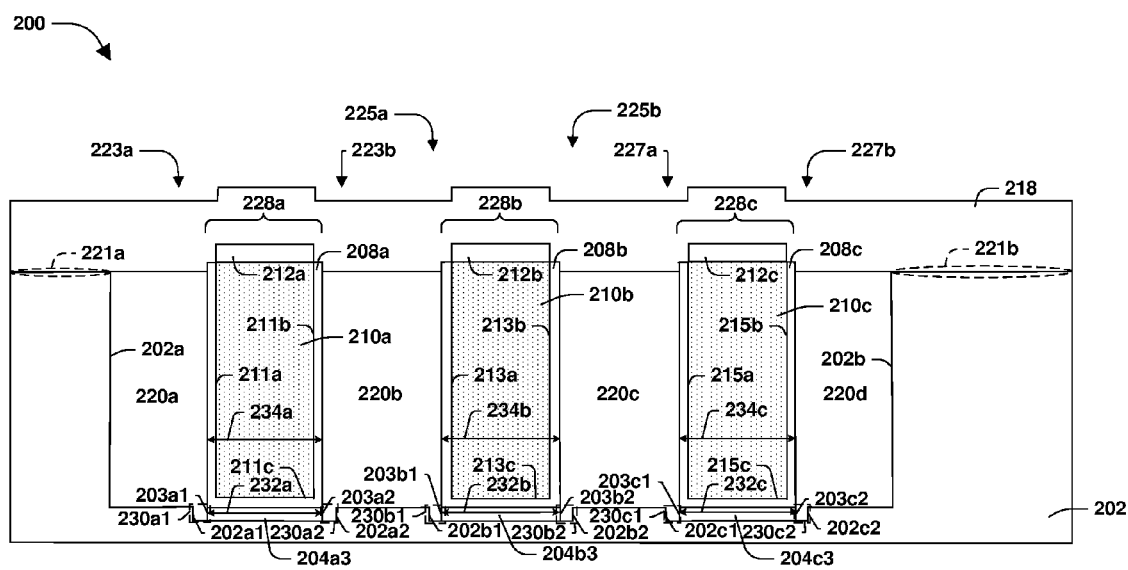
FIG. 10 is an illustration of a semiconductor arrangement, in accordance with some embodiments.

A method 100 of forming a semiconductor arrangement 200 according to some embodiments is illustrated in FIG. 1 and one or more structures formed thereby at various stages of fabrication are illustrated in FIGS. 2-10. In some embodiments, as illustrated in FIG. 10, the semiconductor arrangement 200 comprises a first interconnect 228a adjacent a second interconnect 228b. In some embodiments, the first interconnect 228a is over a first bottom portion 204a3 of a first metal layer 204. In some embodiments, the first metal layer 204, illustrated in FIG. 6, comprises titanium nitride. In some embodiments, the second interconnect 228b is over a second bottom portion 204b3 of the first metal layer 204, as illustrated in FIG. 10. In some embodiments, at least one of the first bottom portion 204a3 or the second bottom portion 204b3 is in contact with a dielectric 202. In some embodiments, the first interconnect 228a comprises a first interconnect metal plug 210a, a first interconnect second metal layer 208a and a first barrier cap 212a. In some embodiments, the first barrier cap 212a is over a top surface of the first interconnect metal plug 210a. In some embodiments, the first interconnect second metal layer 208a surrounds a bottom surface 211c and sidewalls 211a, 211b of the first interconnect metal plug 210a. In some embodiments, the second interconnect 228b comprises a second interconnect metal plug 210b, a second interconnect second metal layer 208b and a second barrier cap 212b. In some embodiments, the second barrier cap 212b is over a top surface of the second interconnect metal plug 210b. In some embodiments, the second interconnect second metal layer 208b surrounds a bottom surface 213c and sidewalls 213a, 213b of the second interconnect metal plug 210b. In some embodiments, the first interconnect second metal layer 208a and the second interconnect second metal layer 208b are formed from a second metal layer 208, as illustrated in FIG. 4, the second metal layer 208 comprising at least one of tantalum or nitride. In some embodiments, a first air gap 220a is defined between a first side 223a of the first interconnect 228a and a first sidewall 202a of the dielectric 202. In some embodiments, a second air gap 220b is defined between a second side 223b of the first interconnect 228a and a first side 225a of the second interconnect 228b. In some embodiments, a first bottom portion width 232a of the first bottom portion 204a3 is substantially equal to a first interconnect width 234a of the first interconnect 228a. In some embodiments, a second bottom portion width 232b of the second bottom portion 204b3 is substantially equal to a second interconnect width 234b of the second interconnect 228b. In some embodiments, a first interconnect first bottom void 230a1 is on the first side 223a of the first interconnect 228a. In some embodiments, the first interconnect first bottom void 230a1 is defined between a first bottom sidewall 203a1 of the first bottom portion 204a3 and a first interconnect first void sidewall 202a1 of the dielectric 202. In some embodiments, a first interconnect second bottom void 230a2 is on the second side 223b of the first interconnect 228a. In some embodiments, the first interconnect second bottom void 230a2 is defined between a second bottom sidewall 203a2 of the first bottom portion 204a3 and a first interconnect second void sidewall 202a2 of the dielectric 202. In some embodiments, a second interconnect first bottom void 230b1 is on the first side 225a of the second interconnect 228b. In some embodiments, the second interconnect first bottom void 230b1 is defined between a first bottom sidewall 203b1 of the second bottom portion 204b3 and a second interconnect first void sidewall 202b1 of the dielectric 202. In some embodiments, a second interconnect second bottom void 230b2 is on a second side 225b of the second interconnect 228b. In some embodiments, the second interconnect second bottom void 230b2 is defined between a second bottom sidewall 203b2 of the second bottom portion 204b3 and a second interconnect second void sidewall 202b2 of the dielectric 202. In some embodiments, a protective barrier 218 is over the first interconnect 228a and the second interconnect 228b. In some embodiments, the protective barrier 218 is in direct physical contact with a second top portion 221a, 221b of a top surface of the dielectric 202. In some embodiments, a plurality of interconnects are contemplated, such as a third interconnect 228c. In some embodiments, an interconnect metal plug 210 surrounded by the second metal layer 208 has greater protection and thus is less susceptible to damage than an interconnect metal plug that is not surrounded by a second metal layer. In some embodiments, the semiconductor arrangement 200 where the protective barrier 218 is in direct physical contact with the dielectric 202 has a reduced parasitic capacitance as compared to a semiconductor arrangement that does not have a protective barrier in direct physical contact with a dielectric. In some embodiments, reduced parasitic capacitance reduces an RC delay, such that a semiconductor arrangement with reduced parasitic capacitance has a reduced RC delay.

Turning to 102 of the method 100, as illustrated in FIG. 3, the first metal layer 204 comprising titanium nitride is formed in a first opening 206a in the dielectric 202, a second opening 206b in the dielectric 202, a third opening 206c in the dielectric 202 and over the dielectric 202, according to some embodiments. Turning to FIG. 2, prior to FIG. 3, the first opening 206a, the second opening 206b and the third opening 206c are in the dielectric 202. In some embodiments, the dielectric 202 comprises at least one of a high dielectric constant material, a medium dielectric constant material or a low dielectric constant material. In some embodiments, the dielectric 202 comprises at least one of an oxide or a nitride. Turning to FIG. 3, the first metal layer 204 is formed by deposition, such as by physical vapor deposition (PVD) or RF PVD. In some embodiments, the first metal layer 204 has a first metal layer thickness between about 100 Å to about 300 Å.

Figure 5:
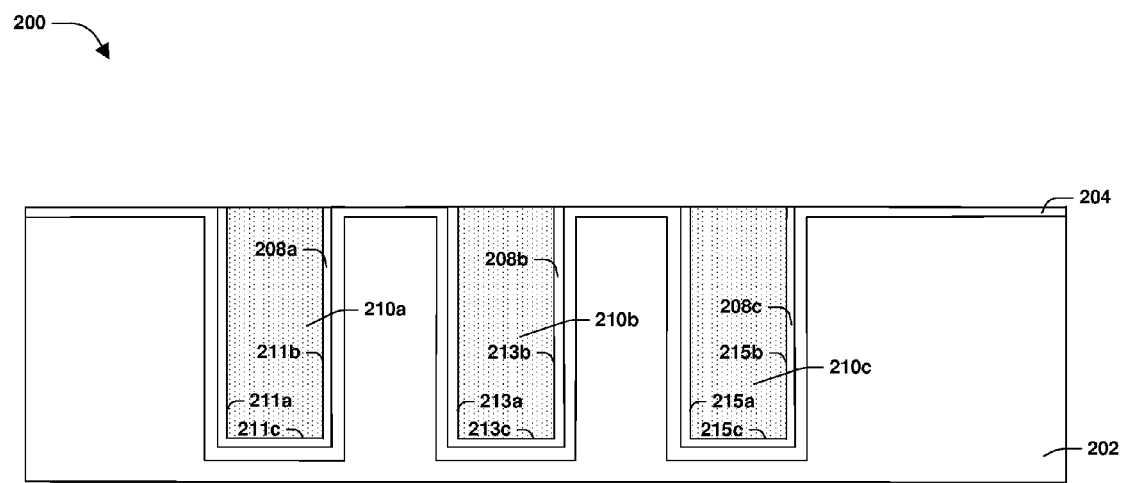
FIG. 5 is an illustration of a semiconductor arrangement, in accordance with some embodiments.
Figure 6:
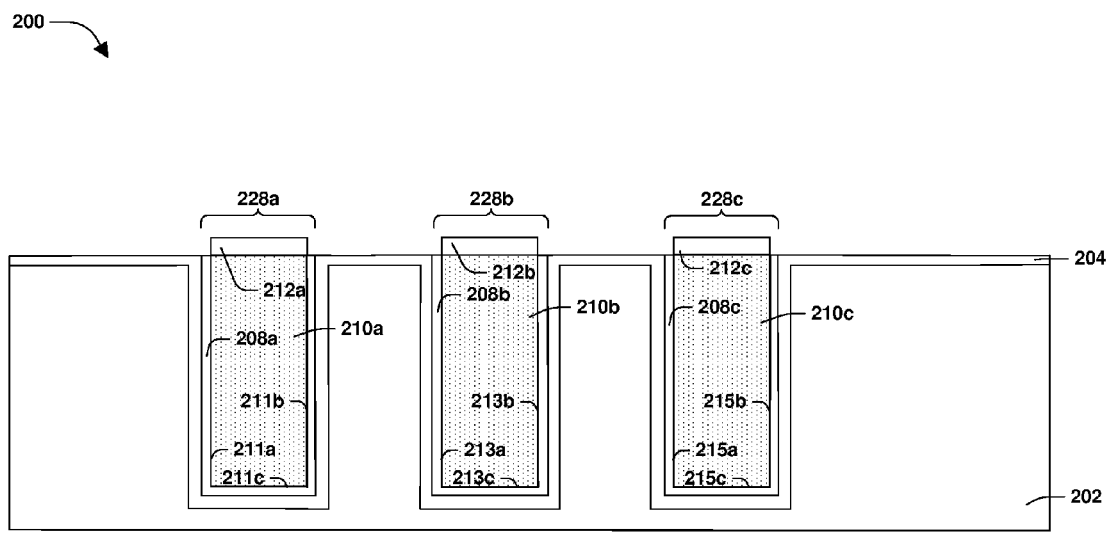
FIG. 6 is an illustration of a semiconductor arrangement, in accordance with some embodiments.

Turning to 104 of the method 100, as illustrated in FIG. 6, the first interconnect 228a is formed over the first metal layer 204 in the first opening 206a, the second interconnect 228b is formed over the first metal layer 204 in the second opening 206b and the third interconnect 228c is formed over the first metal layer 204 in the third opening 206c, according to some embodiments. Turning to FIG. 4, prior to FIG. 6, the second metal layer 208 is formed over the first metal layer 204. In some embodiments, the second metal layer 208 is formed by at least one of PVD, atomic layer deposition (ALD) or chemical vapor deposition (CVD). In some embodiments, the second metal layer 208 has a second metal layer thickness between about 20 Å to about 60 Å. In some embodiments, the second metal layer 208 comprises at least one of tantalum or nitride. Turning to FIG. 5, a layer of metal plug material is formed over the second metal layer 208. In some embodiments, the layer of metal plug material comprises copper. In some embodiments, portions of the metal plug material, such as portions that are above a top surface of the first metal layer 204, are removed, such as by chemical mechanical planarization (CMP), such that the first interconnect metal plug 210a remains in the first opening 206a, the second interconnect metal plug 210b remains in the second opening 206b and a third interconnect metal plug 210c remains in the third opening 206c. In some embodiments, portions of the second metal layer 208, such as portions that are above the top surface of the first metal layer 204, are removed, such as by CMP, such that the first interconnect second metal layer 208a remains in the first opening 206a, the second interconnect second metal layer 208b remains in the second opening 206b and a third interconnect second metal layer 208c remains in the third opening 206c. In some embodiments, the first interconnect second metal layer 208a surrounds the bottom surface 211c and sidewalls 211a, 211b of the first interconnect metal plug 210a. In some embodiments, the second interconnect second metal layer 208b surrounds the bottom surface 213c and sidewalls 213a, 213b of the second interconnect metal plug 210b. In some embodiments, the third interconnect second metal layer 208c surrounds a bottom surface 215c and sidewalls 215a, 215b of the third interconnect metal plug 210c. Turning to FIG. 6, the first barrier cap 212a is formed over the first interconnect metal plug 210a, the second barrier cap 212b is formed over the second interconnect metal plug 210b and a third barrier cap 212c is formed over the third interconnect metal plug 210c. In some embodiments, at least one of the first barrier cap 212a, the second barrier cap 212b or the third barrier cap 212c comprises at least one of cobalt or ruthenium.

Figure 7:
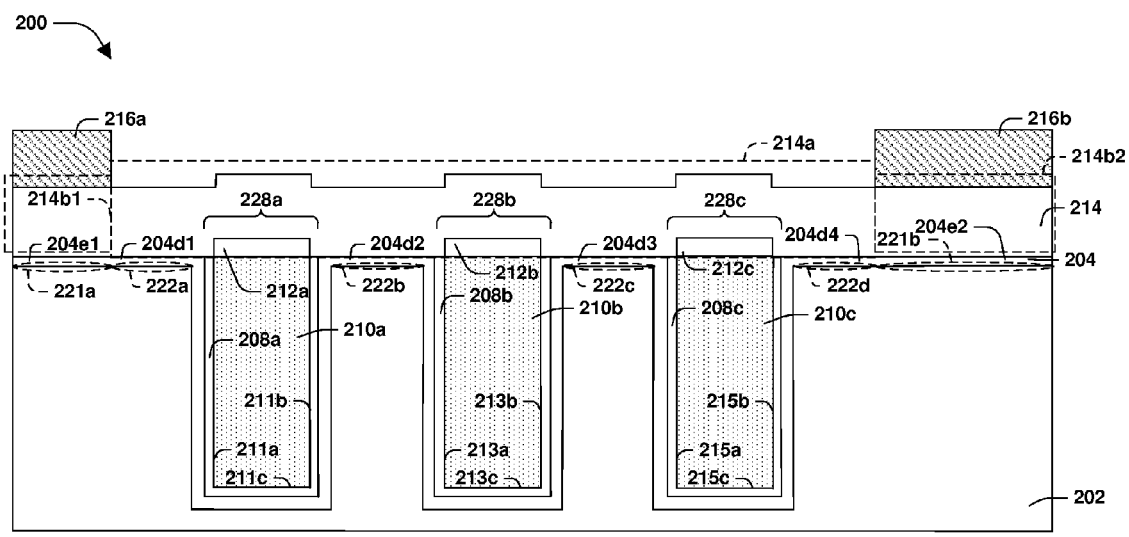
FIG. 7 is an illustration of a semiconductor arrangement, in accordance with some embodiments.

Turning to 106 of the method 100, as illustrated in FIG. 7, a first dielectric layer 214 is formed over the first metal layer 204, the first interconnect 228a, the second interconnect 228b and the third interconnect 228c, according to some embodiments. In some embodiments, the first dielectric layer 214 comprises at least one of a high dielectric constant material, a medium dielectric constant material or a low dielectric constant material. In some embodiments, the first dielectric layer 214 comprises at least one of an oxide or a nitride. In some embodiments, the first dielectric layer 214 is formed by deposition. In some embodiments, a photoresist is formed and patterned such that portions of the photoresist 216a, 216b remain on a second portion 214b1, 214b2 of the first dielectric layer 214 and over a second top portion 221a, 221b of the top surface of the dielectric 202, where there are multiple instances of the photoresist 216, the second portion 214b and the second top portion 221. In some embodiments, a first portion 214a of the first dielectric layer 214 is over a first portion 204d1, 204d2, 204d3, and 204d4 of the first metal layer 204, where there are multiple instances of the first portion 204d of the first metal layer 204, and over the first interconnect 228a, the second interconnect 228b, and the third interconnect 228c. In some embodiments, the first portion 204d1, 204d2, 204d3, and 204d4 of the first metal layer 204 is over a first top portion 222a, 222b, 222c or 222d of the top surface of the dielectric 202, where there are multiple instances of the first top portion 222 of the dielectric 202.

Turning to 108 of the method 100, as illustrated in FIG. 8, a first etch is performed to remove the first portion 214a of the first dielectric layer 214 from over the first interconnect 228a, the second interconnect 228b and the third interconnect 228c and to remove the first portion 204d1, 204d2, 204d3, and 204d4 of the first metal layer 204 from over the first top portion 222a, 222b, 222c or 222d of the top surface of the dielectric 202, such that a first metal layer first portion 204a, a first metal layer second portion 204b and a first metal layer third portion 204c remain, according to some embodiments. In some embodiments, the removal of the first portion 204d1, 204d2, 204d3, and 204d4 of the first metal layer 204 exposes the first top portion 222a, 222b, 222c or 222d of the top surface of the dielectric 202. In some embodiments, the photoresist 216a, 216b is removed, such that the second portion 214b1, 214b2 of the first dielectric layer 214 remains over the second top portion 221a, 221b of the top surface of the dielectric 202, and in contact with a second portion 204e1, 204e2 of the first metal layer 204, where there are multiple instance of the second portion 204e of the first metal layer 204. In some embodiments, the first etch removes the first portion 204d1, 204d2, 204d3, 204d4 of the first metal layer 204, such that at least one of the first metal layer first portion 204a, the first metal layer second portion 204b or the first metal layer third portion 204c has a top surface that is even or flush with the top surface of the dielectric 202.

Turning to 110 of the method 100, as illustrated in FIG. 9, a second etch is performed to form the first air gap 220a on the first side 223a of the first metal layer first portion 204a, the second air gap 220b on the second side 223b of the first metal layer first portion 204a, a third air gap 220c on a first side 227a of the first metal layer third portion 204c, and a fourth air gap 220d on a second side 227b of the first metal layer third portion 204c, according to some embodiments. In some embodiments, the second etch comprises performing at least one of a dry etch or a wet etch. In some embodiments, the second portion 204e1, 204e2 of the first metal layer 204 serves as an etch stop layer. In some embodiments, the second air gap 220b is on the first side 225a of the first metal layer second portion 204b. In some embodiments, the third air gap 220c is on the second side 225b of the first metal layer second portion 204b. In some embodiments, the second etch exposes portions of first sidewalls 204a1, 204a2 of the first metal layer first portion 204a, second sidewalls 204b1, 204b2 of the first metal layer second portion 204b, and third sidewalls 204c1, 204c2 of the first metal layer third portion 204c. In some embodiments, the second etch removes the second portion 214b1, 214b2 of the first dielectric layer 214 to expose the second portion 204e1, 204e2 of the first metal layer 204.

Turning to 112 of the method 100, as illustrated in FIG. 10, a third etch is performed to remove the first sidewalls 204a1, 204a2 of the first metal layer first portion 204a, such that the first bottom portion 204a3 remains under the first interconnect 228a, to remove the second sidewalls 204b1, 204b2 of the first metal layer second portion 204b, such that the second bottom portion 204b3 remain under the second interconnect 228b and to remove the third sidewalls 204c1, 204c2 of the first metal layer third portion 204c, such that a third bottom portion 204c3 remains under the third interconnect 228c. In some embodiments, the third etch comprises a selective etch, where the etchant is selective for the first metal layer 204. In some embodiments, the first air gap 220a is defined between the first side 223a of the first interconnect 228a and the first sidewall 202a of the dielectric 202. In some embodiments, the second air gap 220b is defined between the second side 223b of the first interconnect 228a and the first side 225a of the second interconnect 228b. In some embodiments, the third air gap 220c is defined between the second side 225b of the second interconnect 228b and the first side 227a of the third interconnect 228c. In some embodiments, the fourth air gap 220d is defined between the second side 227b of the third interconnect 228c and a second sidewall 202b of the dielectric 202. In some embodiments, the first bottom portion width 232a of the first bottom portion 204a3 is substantially equal to the first interconnect width 234a of the first interconnect 228a. In some embodiments, the second bottom portion width 232b of the second bottom portion 204b3 is substantially equal to the second interconnect width 234b of the second interconnect 228b. In some embodiments, a third bottom portion width 232c of the third bottom portion 204c3 is substantially equal to a third interconnect width 234c of the third interconnect 228c. In some embodiments, the first interconnect first bottom void 230a1 and the first interconnect second bottom void 230a2 are formed by the removal of the first sidewalls 204a1, 204a2 of the first metal layer first portion 204a. In some embodiments, the second interconnect first bottom void 230b1 and the second interconnect second bottom void 230b2 are formed by the removal of the second sidewalls 204b1, 204b2 of the first metal layer second portion 204b. In some embodiments, a third interconnect first bottom void 230c1 and a third interconnect second bottom void 230c2 are formed by the removal of the third sidewalls 204c1, 204c2 of the first metal layer third portion 204c. In some embodiments, the first interconnect first bottom void 230a1 is defined between the first bottom sidewall 203a1 of the first bottom portion 204a3 and the first interconnect first void sidewall 202a1 of the dielectric 202. In some embodiments, the first interconnect second bottom void 230a2 is defined between the second bottom sidewall 203a2 of the first bottom portion 204a3 and the first interconnect second void sidewall 202a2 of the dielectric 202. In some embodiments, the second interconnect first bottom void 230b1 is defined between the first bottom sidewall 203b1 of the second bottom portion 204b3 and the second interconnect first void sidewall 202b1 of the dielectric 202. In some embodiments, the second interconnect second bottom void 230b2 is defined between the second bottom sidewall 203b2 of the second bottom portion 204b3 and the second interconnect second void sidewall 202b2 of the dielectric 202. In some embodiments, the third interconnect first bottom void 230c1 is defined between a first bottom sidewall 203c1 of the third bottom portion 204c3 and a third interconnect first void sidewall 202c1 of the dielectric 202. In some embodiments, the third interconnect second bottom void 230c2 is defined between a second bottom sidewall 203c2 of the third bottom portion 204c3 and a third interconnect second void sidewall 202c2 of the dielectric 202.

Turning to 114 of the method 100, as illustrated in FIG. 10, the protective barrier 218 is formed over the second top portion 221a, 221b of the top surface of the dielectric 202, the first interconnect 228a, the second interconnect 228b and the third interconnect 228c. In some embodiments, the protective barrier 218 is formed as a thin film. In some embodiments, the protective barrier 218 has a step coverage between about 50% to about 100%. In some embodiments, the protective barrier 218 is formed by at least one of a spin on technique, a sputtering technique, ALD, PVD or CVD. In some embodiments, the protective barrier 218 comprises dielectric material, such as a low dielectric constant material. In some embodiments, the protective barrier 218 comprises at least one of an oxide or a nitride. Alternatively or additionally, the protective barrier 218 includes another dielectric material, according to some embodiments. In some embodiments, the protective barrier 218 has a thickness between about 500 Å to about 1500 Å. In some embodiments, the protective barrier 218 is in direct physical contact with the second top portion 221*a*, 221*b* of the top surface of the dielectric 202. In some embodiments, the interconnect metal plug 210 surrounded by the second metal 208 has greater protection and thus less is less susceptible to damage than an interconnect metal plug that is not surrounded by a second metal layer. In some embodiments, the semiconductor arrangement 200 where the protective barrier 218 is in direct physical contact with the dielectric 202 has a reduced parasitic capacitance as compared to a semiconductor arrangement that does not have a protective barrier in direct physical contact with a dielectric. In some embodiments, reduced parasitic capacitance reduces an RC delay, such that a semiconductor arrangement with reduced parasitic capacitance has a reduced RC delay.

According to some embodiments, a method of forming a semiconductor arrangement comprises forming a first metal layer in a first opening of a dielectric, a second opening of the dielectric and over the dielectric, the first metal layer comprising titanium nitride. According to some embodiments, the method of forming a semiconductor arrangement comprises forming a first interconnect over the first metal layer in the first opening, forming a second interconnect over the first metal layer in the second opening and forming a first dielectric layer over the first metal layer, the first interconnect and the second interconnect. According to some embodiments, the method of forming a semiconductor arrangement comprises performing a first etch to remove a first portion of the first dielectric layer over the first interconnect, the second interconnect and a first portion of the first metal layer and to remove the first portion of the first metal layer from a first top portion of the top surface of the dielectric, such that a first metal layer first portion remains in the first opening and a first metal layer second portion remains in the second opening. According to some embodiments, the method of forming a semiconductor arrangement comprises performing a second etch to form a first air gap on first side of the first metal layer first portion and to form a second air gap on a second side of the first metal layer first portion, such that the second air gap is between the first metal layer first portion and the first metal layer second portion. According to some embodiments, the method of forming a semiconductor arrangement comprises performing a third etch to remove first sidewalls of the first metal layer first portion, such that a first bottom portion of the first metal layer remains under the first interconnect, and to remove second sidewalls of the first metal layer second portion, such that a second bottom portion of the first metal layer remains under the second interconnect. According to some embodiments, the method of forming a semiconductor arrangement comprises forming a protective barrier over the first interconnect and the second interconnect.

According to some embodiments, a semiconductor arrangement comprises a first interconnect adjacent a second interconnect, the first interconnect over a first bottom portion of a first metal layer comprising titanium nitride. In some embodiments, the first bottom portion is in contact with a dielectric. In some embodiments, the first interconnect comprises a first interconnect metal plug, a first interconnect second metal layer and a first barrier cap, the first barrier cap over a top surface of the first interconnect metal plug and the first interconnect second metal layer surrounding a bottom surface and sidewalls of the first interconnect metal plug. In some embodiments, a protective barrier is over the first interconnect and the second interconnect, where a first air gap is defined between a first side of the first interconnect and a first sidewall of the dielectric and a second air gap is defined between a second side of the first interconnect and a first side of the second interconnect.

According to some embodiments, a method of forming a semiconductor arrangement comprises forming a first metal layer in a first opening of a dielectric, a second opening of the dielectric and over the dielectric, the first metal layer comprising titanium nitride. According to some embodiments, the method of forming a semiconductor arrangement comprises forming a first interconnect over the first metal layer in the first opening, forming a second interconnect over the first metal layer in the second opening and forming a first dielectric layer over the first metal layer, the first interconnect and the second interconnect. According to some embodiments, the method of forming a semiconductor arrangement comprises performing a first etch to remove a first portion of the first dielectric layer over the first interconnect, the second interconnect and a first portion of the first metal layer and to remove the first portion of the first metal layer from a first top portion of the top surface of the dielectric, such that a first metal layer first portion remains in the first opening and a first metal layer second portion remains in the second opening. According to some embodiments, the method of forming a semiconductor arrangement comprises performing a second etch to form a first air gap on first side of the first metal layer first portion and to form a second air gap on a second side of the first metal layer first portion, such that the second air gap is between the first metal layer first portion and the first metal layer second portion. According to some embodiments, the method of forming a semiconductor arrangement comprises performing a third etch to remove first sidewalls of the first metal layer first portion, such that a first bottom portion of the first metal layer remains under the first interconnect, and to remove second sidewalls of the first metal layer second portion, such that a second bottom portion of the first metal layer remains under the second interconnect. According to some embodiments, the method of forming a semiconductor arrangement comprises depositing a low dielectric constant material onto the first interconnect, the second interconnect and a second top portion of the top surface of the dielectric to form a protective barrier over the first interconnect, the second interconnect and the second top portion, where the protective barrier is in direct physical contact with the second top portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a dielectric layer;
   a first metal layer overlying a first portion of the dielectric layer, wherein:
      a first void is defined by a first sidewall of the first metal layer and a first sidewall of the dielectric layer, and
      the first sidewall of the first metal layer is spaced apart from the first sidewall of the dielectric layer by a first distance; and
   a first interconnect overlying the first metal layer and comprising:
      a first interconnect metal plug; and
      a first interconnect metal layer surrounding sidewalls and a bottom surface of the first interconnect metal plug, wherein:
         a second void is defined by a first sidewall of the first interconnect metal layer and a second sidewall of the dielectric layer, and
         the first sidewall of the first interconnect metal layer is spaced apart from the second sidewall of the dielectric layer by a second distance different than the first distance.

2. The semiconductor arrangement of claim 1, wherein the first void and the second void form a first airgap.

3. The semiconductor arrangement of claim 2, comprising:
   a barrier layer overlying the first interconnect and overlying the dielectric layer.

4. The semiconductor arrangement of claim 3, wherein the barrier layer overlies the first airgap.

5. The semiconductor arrangement of claim 1, comprising:
   a barrier layer overlying the first interconnect and overlying the dielectric layer.

6. The semiconductor arrangement of claim 5, wherein the second void is further defined by a bottom surface of the barrier layer.

7. The semiconductor arrangement of claim 5, wherein the barrier layer contacts a top surface of the dielectric layer and a top surface of the first interconnect metal plug.

8. The semiconductor arrangement of claim 1, wherein the first metal layer contacts a top surface of the first portion of the dielectric layer.

9. The semiconductor arrangement of claim 1, wherein the first interconnect metal layer contacts a top surface of the first metal layer.

10. The semiconductor arrangement of claim 1, comprising:
    a second metal layer overlying a second portion of the dielectric layer, wherein the second metal layer is spaced apart from the first metal layer by a third portion of the dielectric layer.

11. The semiconductor arrangement of claim 10, wherein:
    a third void is defined by a second sidewall of the first metal layer and a first sidewall of the third portion of the dielectric layer, and
    a fourth void is defined by a first sidewall of the second metal layer and a second sidewall of the third portion of the dielectric layer.

12. The semiconductor arrangement of claim 1, wherein the first metal layer is titanium nitride and the first interconnect metal layer is tantalum nitride.

13. The semiconductor arrangement of claim 12, wherein the first metal layer contacts the first interconnect metal layer.

14. A semiconductor arrangement, comprising:
    a dielectric layer;
    a first metal layer overlying a first portion of the dielectric layer, wherein:
       a first void is defined by a first sidewall of the first metal layer and a first sidewall of the dielectric layer; and
    a first interconnect overlying the first metal layer and comprising:

a first interconnect metal plug; and a first interconnect metal layer, wherein:

a second void is defined by a first sidewall of the first interconnect metal layer and a second sidewall of the dielectric layer, and the first void and the second void form a first airgap.

15. The semiconductor arrangement of claim 14, comprising:

a barrier layer overlying the first interconnect and overlying the dielectric layer.

16. The semiconductor arrangement of claim 15, wherein the second void is further defined by a bottom surface of the barrier layer.

17. The semiconductor arrangement of claim 15, wherein:

the barrier layer contacts a top surface of the dielectric layer, a top surface of the first interconnect metal layer, and a top surface of the first interconnect metal plug.

18. The semiconductor arrangement of claim 14, wherein:

the first sidewall of the first metal layer is spaced apart from the first sidewall of the dielectric layer by a first distance, and the first sidewall of the first interconnect metal layer is spaced apart from the second sidewall of the dielectric layer by a second distance different than the first distance.

19. The semiconductor arrangement of claim 14, wherein:

the first metal layer contacts a top surface of the first portion of the dielectric layer, and the first interconnect metal layer contacts a top surface of the first metal layer.

20. A semiconductor arrangement, comprising:

a dielectric layer;

a first metal layer contacting a first portion of the dielectric layer, wherein:

a first void is defined by a first sidewall of the first metal layer and a first sidewall of the dielectric layer, and the first sidewall of the first metal layer is spaced apart from the first sidewall of the dielectric layer by a first distance; and a first interconnect metal layer in contact with the first metal layer, wherein:

a second void is defined by a first sidewall of the first interconnect metal layer and a second sidewall of the dielectric layer, and the first sidewall of the first interconnect metal layer is spaced apart from the second sidewall of the dielectric layer by a second distance different than the first distance.

* * * * *